(12) United States Patent
Sakharshete et al.

(10) Patent No.: US 12,072,952 B2
(45) Date of Patent: Aug. 27, 2024

(54) DATA COMPRESSOR FOR APPROXIMATION OF MATRICES FOR MATRIX MULTIPLY OPERATIONS

(71) Applicant: Advanced Micro Devices, Inc., Santa Clara, CA (US)

(72) Inventors: Swapnil P. Sakharshete, San Diego, CA (US); Pramod Vasant Argade, San Diego, CA (US); Maxim V. Kazakov, San Diego, CA (US); Alexander M. Potapov, San Diego, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 515 days.

(21) Appl. No.: 17/214,779

(22) Filed: Mar. 26, 2021

(65) Prior Publication Data

US 2022/0309125 A1 Sep. 29, 2022

(51) Int. Cl.
*G06F 17/16* (2006.01)
*G06F 7/523* (2006.01)
*G06F 7/544* (2006.01)
*H03K 19/173* (2006.01)

(52) U.S. Cl.
CPC .............. *G06F 17/16* (2013.01); *G06F 7/523* (2013.01); *G06F 7/5443* (2013.01); *H03K 19/1737* (2013.01)

(58) Field of Classification Search
CPC .............................. G06F 17/16; G06F 7/5443
See application file for complete search history.

(56) References Cited

U.S. PATENT DOCUMENTS

| 8,620,984 | B2 * | 12/2013 | Mazahreh | H04B 7/0413 |
| | | | | 708/522 |
| 9,600,194 | B1 * | 3/2017 | Gschwind | G06F 9/30043 |
| 10,747,501 | B2 * | 8/2020 | Heddes | G06F 7/49936 |

(Continued)

FOREIGN PATENT DOCUMENTS

| DE | 102013018915 A1 | 5/2014 |
| KR | 1020200050895 A | 5/2020 |

OTHER PUBLICATIONS

Artemov, Anton V., "Approximate Multiplication of Nearly Sparse Matrices with Decay in a Fully Recursive Distributed Task-Based Parallel Framework", arXiv:1906.08148v7, Feb. 20, 2021, 27 pgs.

(Continued)

*Primary Examiner* — Michael D. Yaary
(74) *Attorney, Agent, or Firm* — Volpe Koenig

(57) ABSTRACT

A processing device is provided which comprises memory configured to store data and a processor. The processor comprises a plurality of MACs configured to perform matrix multiplication of elements of a first matrix and elements of a second matrix. The processor also comprises a plurality of logic devices configured to sum values of bits of product exponents values of the elements of the first matrix and second matrix and determine keep bit values for product exponents values to be kept for matrix multiplication. The processor also comprises a plurality of multiplexor arrays each configured to receive bits of the elements of the first matrix and the second matrix and the keep bit values and provide data for selecting which elements of the first matrix and the second matrix values are provided to the MACs for matrix multiplication.

20 Claims, 6 Drawing Sheets

(56) References Cited

U.S. PATENT DOCUMENTS

| | | | |
|---|---|---|---|
| 11,150,298 B1* | 10/2021 | Bingham | G01R 31/31917 |
| 2009/0024685 A1 | 1/2009 | Salama et al. | |
| 2012/0198212 A1* | 8/2012 | Raubuch | G06F 7/5443 |
| | | | 712/E9.017 |
| 2013/0007075 A1* | 1/2013 | Oliver | G06F 7/483 |
| | | | 708/203 |
| 2014/0143564 A1 | 5/2014 | Tannenbaum et al. | |
| 2014/0331014 A1 | 11/2014 | Liao | |
| 2014/0351564 A1 | 11/2014 | Bekas et al. | |
| 2014/0365548 A1 | 12/2014 | Mortensen | |
| 2016/0140084 A1 | 5/2016 | Daga et al. | |
| 2017/0147531 A1 | 5/2017 | Costas et al. | |
| 2019/0042250 A1* | 2/2019 | Anders | G06F 17/16 |
| 2019/0065146 A1* | 2/2019 | Heddes | G06F 7/483 |
| 2019/0212980 A1 | 7/2019 | Malladi | |
| 2019/0272308 A1 | 9/2019 | Doi | |
| 2019/0340492 A1* | 11/2019 | Burger | G06N 3/08 |
| 2020/0364558 A1 | 11/2020 | Kwon et al. | |
| 2022/0075598 A1* | 3/2022 | Werner | G06F 7/5443 |
| 2022/0108157 A1 | 4/2022 | Hunter et al. | |
| 2022/0291901 A1 | 9/2022 | Zhang et al. | |

OTHER PUBLICATIONS

Scott, M. L.; "Programming Language Pragmatics (3rd Edition)", Morgan Kaufmann Publishers, 2009, 28 pgs.

Joe Z., Answer on "Converting Int to Float or Float to Int using Bitwise operations (software floating point)", Dec. 2013, Stack Overflow, p. 2, Snapshot from Wayback Machine captures on Occtober 6, 2019, 6 pgs.

Myer, T. H., & Sutherland, I. E., "On the Design of Display Processors", Communication of the ACM, vol. 11, No. 6, pp. 410-414, Jun. 1968, 5 pgs.

Artemov, Anton G., Approximate Multiplication of Nearly Sparse Matrices with Decay in a Fully Recursive Distributed Task-Based Parallel Framework, arXiv:1906.08148v7, Feb. 20, 2021, 27 pgs.

* cited by examiner

FIG. 5A

| 1100 | 1110 | 1001 | 0100 | 1010 | 1011 | 0010 | 1111 |

FIG. 5B

| 1100 | 1110 | 1001 | 1100 | 1010 | 1011 | 1000 | 1110 |

FIG. 5C

| 1100 | 1110 | 1001 | 1100 | 1011 | 1011 | 1011 | 1111 |

FIG. 5D

| 1000 | 1000 | 1000 | 1000 | 1000 | 1000 | 1000 | 1000 |

DATA COMPRESSOR FOR APPROXIMATION OF MATRICES FOR MATRIX MULTIPLY OPERATIONS

CROSS REFERENCE TO RELATED APPLICATION(S)

This application is being filed concurrently with U.S. Non-Provisional patent application Ser. No. 17/214,784 entitled APPROXIMATION OF MATRICES FOR MATRIX MULTIPLY OPERATIONS and is incorporated herein by reference as if fully set forth.

BACKGROUND

Matrix multiplication is a key building block across a number of application domains, including use in high performance computing (HPC) and machine learning. Matrix multiplication is also used in convolutional neural networks, recurrent neural networks and other forms of artificial neural networks.

Matrix multiplication techniques employ parallelization to increase the efficiency of matrix multiplication. For example, two matrices are typically divided into smaller portions (e.g., columns, rows, and portions of columns and rows) and a matrix multiplication operation of the two matrices is performed by executing a plurality of matrix multiplication computations each including the multiplication of a portion of one matrix with a portion of another matrix. The matrix multiplication computations are mapped to and executed by different processor cores of a processor network to perform the matrix multiplication operation.

BRIEF DESCRIPTION OF THE DRAWINGS

A more detailed understanding can be had from the following description, given by way of example in conjunction with the accompanying drawings wherein:

FIG. 5A shows a first example of an array of approximated product exponent values according to features of the disclosure;

FIG. 5B shows a second example of an array of approximated product exponent values according to features of the disclosure;

FIG. 5C shows a third example of an array of approximated product exponent values according to features of the disclosure;

FIG. 5D shows a fourth example of an array of approximated product exponent values according to features of the disclosure.

DETAILED DESCRIPTION

Figure 1:
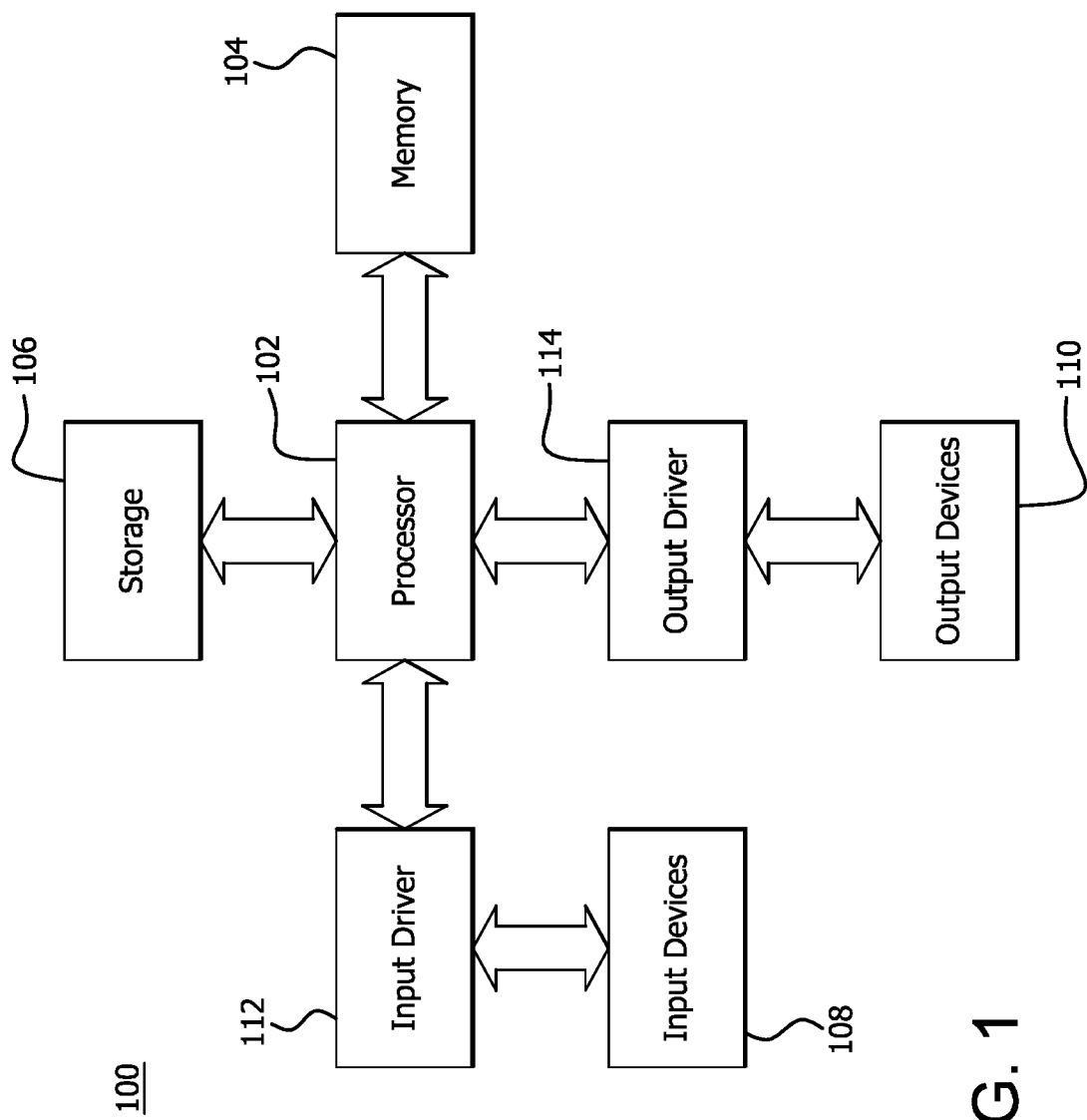
FIG. 1 is a block diagram of an example device in which one or more features of the disclosure can be implemented.

As used herein, programs include sequences of instructions to be executed using one or more processors to perform procedures or routines (e.g., operations, computations, functions, processes, jobs). Processing of programmed instructions and data includes one or more of a plurality of processing stages, such as but not limited to fetching, decoding, scheduling for execution, executing and decoding the programmed instructions and data. Programmed instructions include, for example, applications and control programs, such as operating systems. Processors include, for example, multiple processing cores (e.g., compute units (CUs)) each of which are configured to read and execute program instructions, such as instructions to perform matrix multiplications.

Matrix multiplication includes calculating dot products of sub-portions of data of a first matrix and a second matrix. A matrix multiplication operation includes the calculation $C=A\times B$, where A, B, C are matrices of sizes $M\times K$, $K\times N$, and $M\times N$, respectively. Each element in matrix C is a dot product of a row of matrix A and a column of matrix B. For example, a multiply accumulate operation calculates the product of a pair of values, each value corresponding to an element of a portion (e.g., row, column, part of a row or column, or multiple rows or columns) of a matrix, and adds the product to an accumulator using hardware components known as a multiplier accumulator (MAC). For example, a 64×64 product can be implemented as four 16×16 MACs or eight 8×8 MACs. Matrix multiplication typically involves many calculations, which is time consuming and expensive.

The present application provides devices and methods for efficiently performing an approximation of matrix multiplication. Features of the present disclosure include data compression hardware configured to dynamically determine an output matrix by dropping a number of products (i.e., products of pairs of elements of two input matrices), along the common dimension K of the two matrices, from the products to be used for the dot product calculations of the matrix multiplication of input matrices. The dropped products are the products approximated as having the smallest exponent sums among the products to be used for the dot product calculations.

The data compression hardware includes keep logic and sets of multiplexor arrays. The keep logic is configured to determine keep bit values, based on approximated product exponent values, and provide the keep bit values to the sets of multiplexor arrays for determining which elements, among an array of data elements of the two matrices, are to be kept (i.e., not dropped) and provided to the MACs for matrix multiplication. The keep logic determines a target number of element values, among an array of element values of each matrix, to be kept by summing bit values of the same significance for each of the approximated product exponent values and comparing the sums to the target number (e.g., 6), starting with summing the most significant bits (MSBs) of the product exponent values and continuing through each set of corresponding next significant bits. Features of the present disclosure reduce the number of products without first sorting the elements of the input arrays according to their values, which would otherwise be expensive to implement in hardware.

For example, a 64×64 product is reduced to a 48×48 product by keeping the largest approximated 48 product values (i.e., dropping the lowest 16 approximated values) among the 64×64 product values. By way of example, if a 64×64 product is implemented as a 16×16 MAC, four 16×16 MACs are reduced to three 16×16 MACs, resulting in a 25% reduction time to execute the task and a reduction in energy cost to execute the task. Likewise, if the 64×64 product is implemented as an 8×8 MAC, eight 8×8 MACs are reduced to 6 8×8 MACs, also resulting in a 25% reduction time. A target number of element values to be kept and provided to the MACs to execute the matrix multiplication, or a target number of product values to be dropped (i.e., dropped product values) from the product values, can be any number and is determined based on various factors during runtime, such as an amount of result error that can be tolerated by the approximations for a particular task or application. For example, when used for machine learning training, a target number of products determined to be dropped is based on the effect the approximations will have on the accuracy of a resulting network. The target number of products values to be dropped can also be determined based the size of the common dimension K. For example, based on heuristics, additional product values can be dropped for larger values of K and additional product values can kept and provided to the MACs for lower values of K.

Features of the present disclosure include performing matrix multiplication for a variety of different data types, such as float data types (e.g., FP32, FP16 and BF16 formats) and integer data types (e.g., int8 format).

A processing device is provided which comprises memory configured to store data and a processor. The processor comprises a plurality of MACs configured to perform matrix multiplication of elements of a first matrix and elements of a second matrix. The processor also comprises a plurality of logic devices configured to sum values of bits of product exponents values of the elements of the first matrix and second matrix and determine keep bit values for product exponents values to be kept for matrix multiplication. The processor also comprises a plurality of multiplexor arrays each configured to receive bits of the elements of the first matrix and the second matrix and the keep bit values and provide data for selecting which elements of the first matrix and the second matrix values are provided to the MACs for matrix multiplication.

A processing device is provided which comprises memory configured to store data and a plurality of processor cores in communication with each other. Each processor core comprises a plurality of MACs configured to perform matrix multiplication of elements of a first matrix and elements of a second matrix, a plurality of logic devices configured to sum values of bits of approximated product exponents of the elements of the first matrix and second matrix and generate keep bit values and a plurality of multiplexor arrays each configured to receive the product exponents and the keep bit values and provide data for selecting which of the product exponents are provided to the MACs for matrix multiplication.

A processing device used for matrix multiplication is provided which comprises a plurality of MACs configured to perform matrix multiplication of elements of a first matrix and elements of a second matrix. The processing device also comprises a plurality of logic devices configured to sum values of bits of product exponents values of the elements of the first matrix and second matrix and determine keep bit values for product exponents values to be kept for matrix multiplication. The processing device further comprises a plurality of multiplexor arrays each configured to receive bits of the product exponent values and the keep bit values and provide data for selecting which of the product exponents are provided to the MACs for matrix multiplication.

FIG. 1 is a block diagram of an example device 100 in which one or more features of the disclosure can be implemented. The device 100 includes, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 also optionally includes an input driver 112 and an output driver 114. It is understood that the device 100 can include additional components not shown in FIG. 1.

In various alternatives, the processor 102 includes any accelerated processing device, such as a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), including dynamic RAM (DRAM) and static RAM (SRAM). The RAM includes for example, cache memory, scratchpad memory and registers.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

Features of the present disclosure are described herein using CUs as an example of processor cores. CUs include one or more single instruction, multiple data (SIMD) units that are configured to perform operations at the request of the processor 102 in a parallel manner according to a SIMD paradigm. The SIMD paradigm is one in which multiple processing elements share a single program control flow unit and program counter and thus execute the same program but are able to execute that program with different data. In one example, each SIMD unit includes sixteen lanes, where each lane executes the same instruction at the same time as the other lanes in a SIMD unit but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow. The parallelism afforded by CUs is suitable for matrix multiplication, such as for example, matrix multiplication used in graphics related operations such as pixel value calculations, vertex transformations, and other graphics operations.

Figure 2:
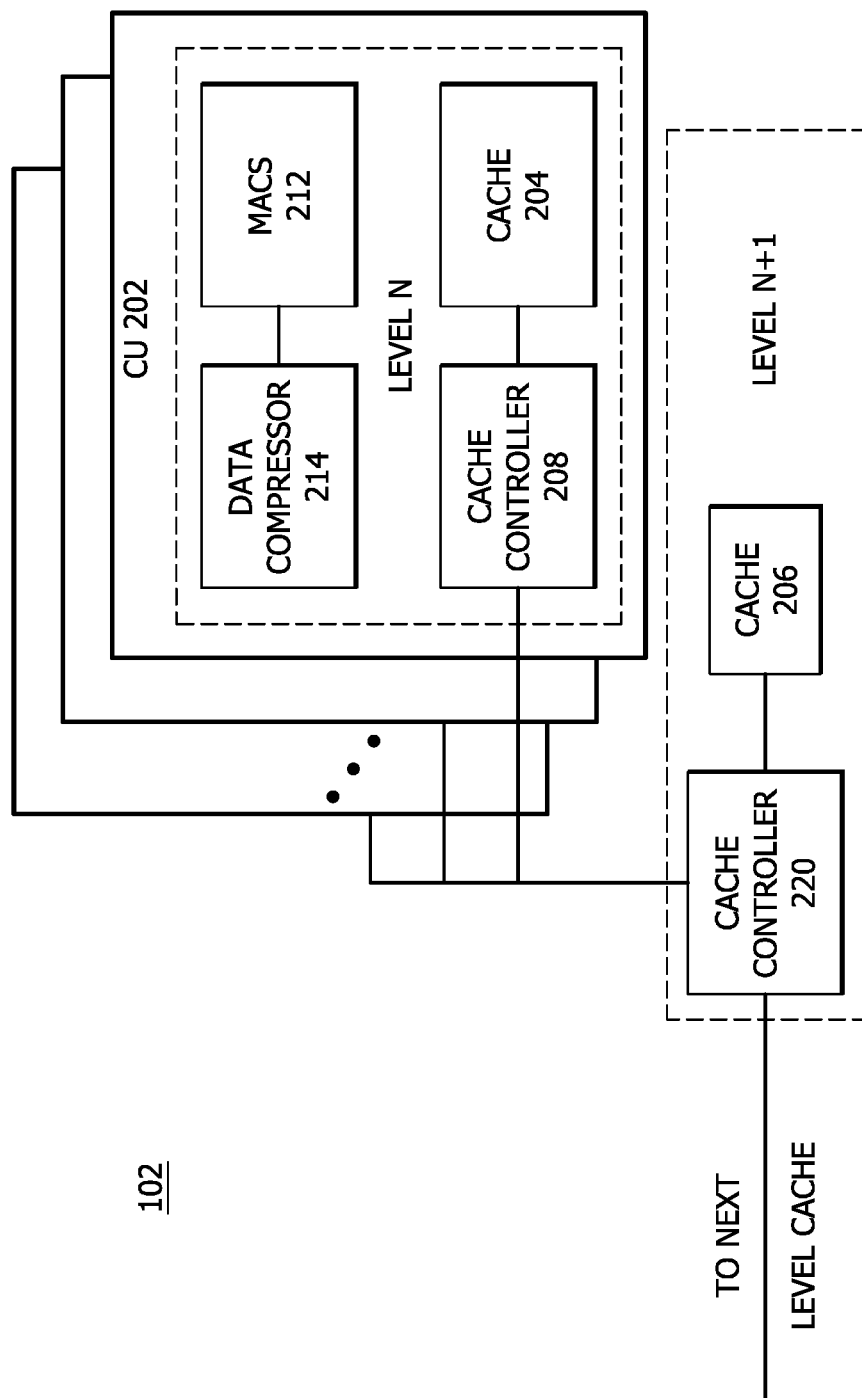
FIG. 2 is a block diagram illustrating exemplary components of a processor in which one or more features of the disclosure can be implemented.

FIG. 2 is a block diagram illustrating an example of processor 102 shown in FIG. 1 in which one or more features of the disclosure can be implemented. As shown in FIG. 2, processor 102 includes a plurality of CUs 202. Each CU 202 includes a level N (e.g., level 1) cache controller 208 in communication with a corresponding level N cache 204 and is configured to process data using the corresponding level N cache 204. Alternatively, a plurality of level N cache controllers 208 (e.g., a cache controller 208 for each CU 202 or a plurality of cache controllers 208 each in communication with a group of CUs 202) is used to process data.

As shown in FIG. 2, processor 102 also includes a level N+1 (e.g., level 2) cache controller 210 in communication with level N+1 cache 206 and is configured to process data using a level N+1 cache 206. Alternatively, a plurality of level N+1 cache controllers, in communication with one or more corresponding level N+1 caches, is used to process data. As shown in FIG. 2, cache controller 210 is also in communication with a next cache level (e.g., level 3) and each level N cache controller 208. Additionally, or alternatively, each CU 202 is in communication with different types of memory 104, such as registers and scratchpad memory.

As shown in FIG. 2, each CU 202 also includes MACs 212 and data compressor 214 in communication with the MACs 212. The MACs 212 are configured to calculate products of element pairs of portions of matrices (e.g., approximated products exponent values) and accumulate (e.g., store) the products to execute matrix multiplication operations.

For example, two matrices are typically divided into smaller portions (e.g., columns, rows, and portions of columns and rows) and a matrix multiplication operation of the two matrices is performed by executing a plurality of matrix multiplication computations each including the multiplication of a portion of one matrix with a portion of another matrix. The matrix multiplication computations are mapped to and executed by different processor cores (e.g., CUs 202) to perform the matrix multiplication operation.

Figure 6:
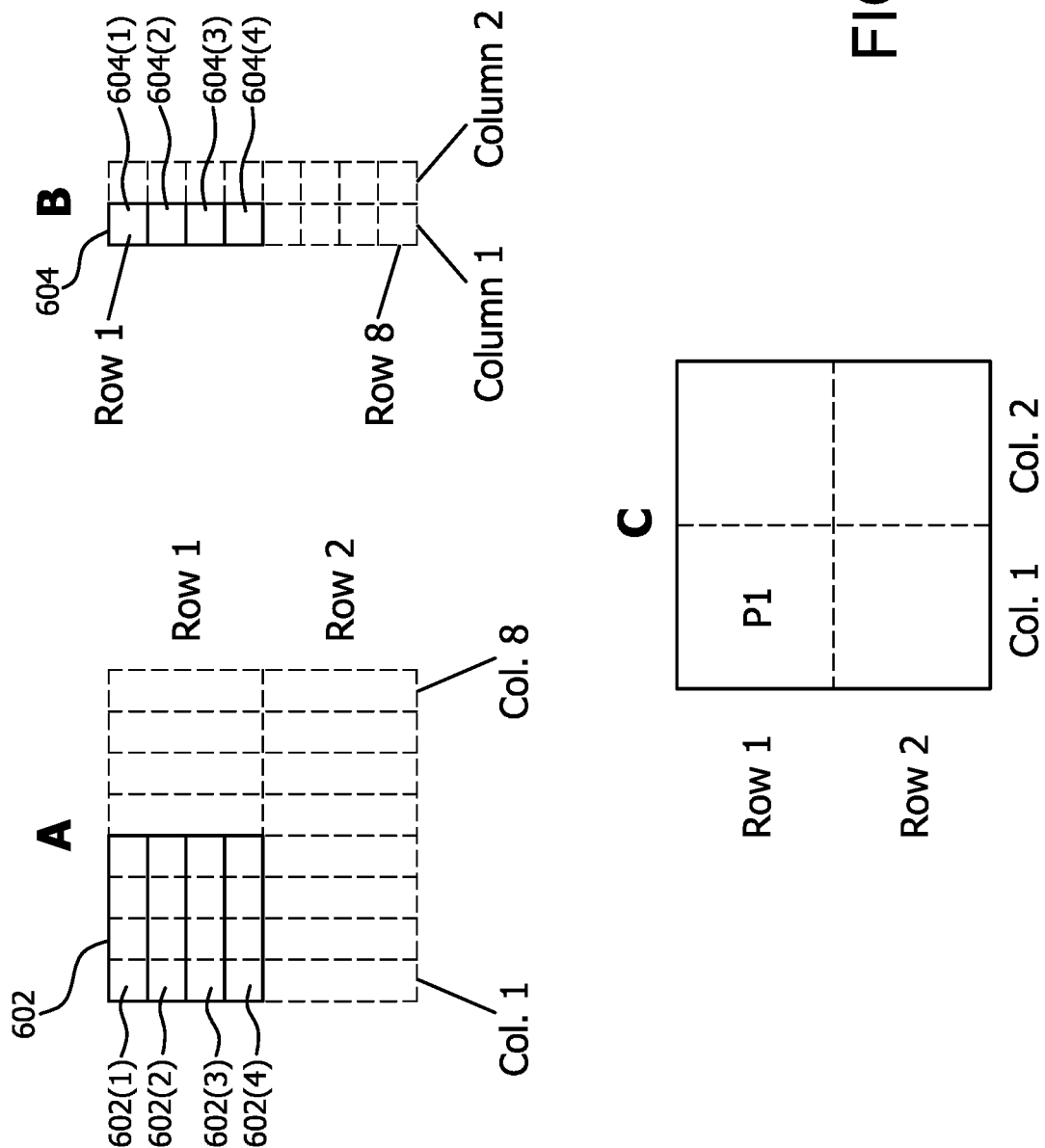
FIG. 6 is a diagram illustrating an example of partial matrix multiplication of two matrices, A and B, and an output matrix C according to features of the disclosure.

An example of a partial matrix multiplication of two matrices, A and B, and an output matrix C is illustrated in FIG. 6. A matrix multiplication operation includes the calculation C=A×B, where A, B, C are matrices of sizes M×K, K×N, and M×N, respectively. Each element in matrix C is a dot product of a row of matrix A and a column of matrix B. Matrix A and matrix B are illustrated at the top of FIG. 6. For example, a part of the matrix multiplication of matrices A and B is performed, according to features of the present disclosure, by approximating product values of the 4 elements 602(1)-602(4) of element array 602 of matrix B and 4 corresponding elements 604(1)-604(4) of array 604 of matrix B to produce the result in portion 1 (P1) of matrix C.

Although the sizes of matrix A and matrix B in FIG. 6 are different from each other, matrix multiplication operation can be performed for matrices if the number of columns in one matrix is equal to the number of rows in the other matrix. In the example shown in FIG. 6, matrix A includes eight columns and matrix B includes 8 rows. The number of columns and rows in matrices A and B are merely an example. Matrix multiplication is performed, according to features of the present disclosure, for matrices of any size meeting the general rules for matrix multiplication (e.g., number of columns in matrix A is equal to the number of rows in matrix B.

As described in more detail below with regard to FIG. 3, data compressor 214 includes hardware circuitry configured to dynamically determine the output matrix C, by dropping a number of products (i.e., products of pairs of elements of two input matrices), along the common dimension K of the two matrices, from the products to be used for the dot product calculations of the matrix multiplication of input matrices. The dropped products are the products approximated as having the smallest exponent sums among the products to be used for the dot product calculations.

Figure 3:
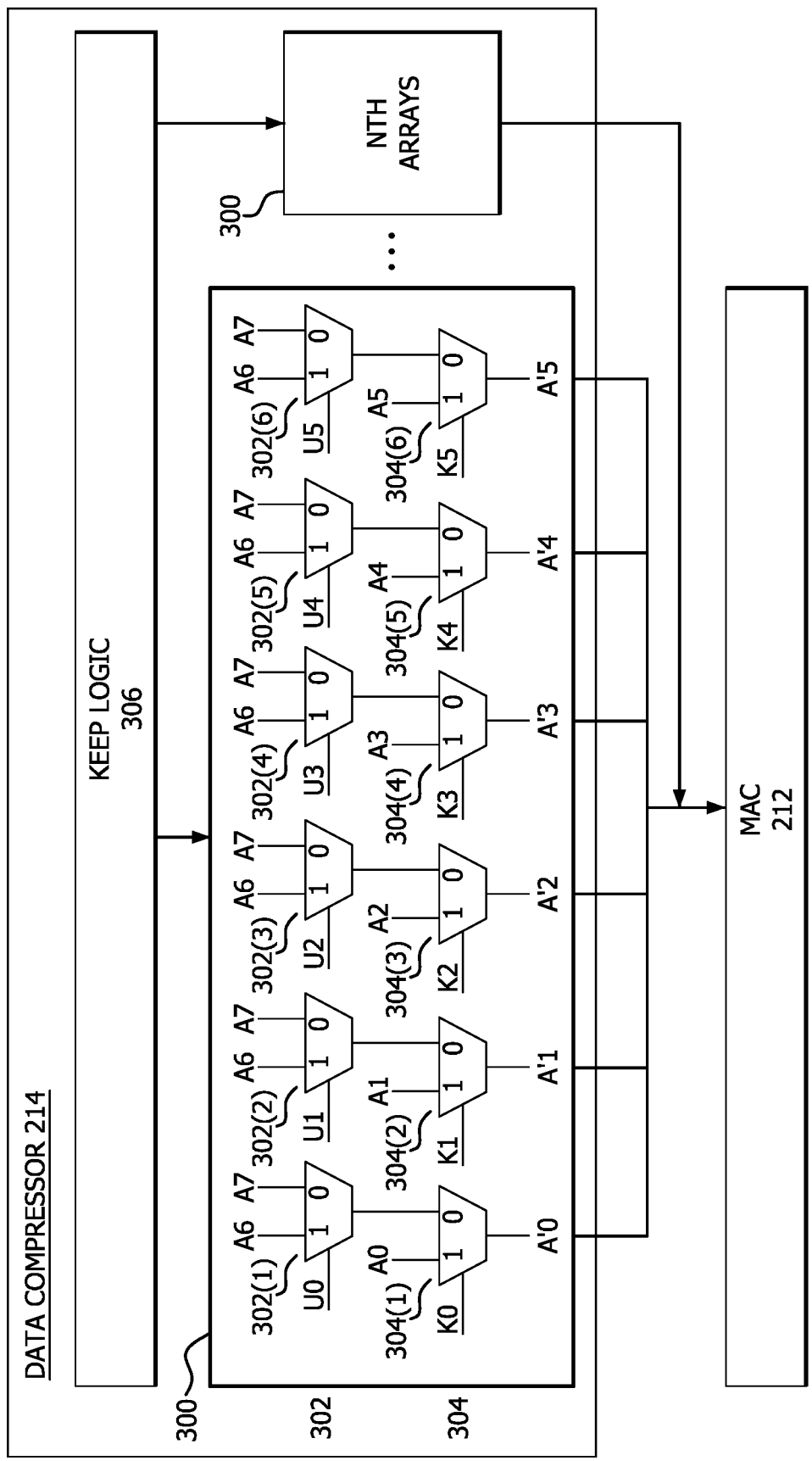
FIG. 3 is a diagram illustrating example components of the data compressor and MACs shown in FIG. 2, for implementing one or more features of the disclosure.

FIG. 3 is a diagram illustrating example components of the data compressor 214 and a MAC 212 shown in FIG. 2, for implementing one or more features of the disclosure. As shown in FIG. 3, the data compressor 214 includes keep logic 306 sets of multiplexor arrays 300, each having 6 multiplexors. The number of multiplexors shown in FIG. 3 is used as an example for selecting 6 elements from an array of 8 data elements. Features of the disclosure can include different numbers of multiplexors depending on the sizes of the portions of the matrices and the number of target products to be kept for matrix multiplication.

The keep logic 306 includes logic circuitry, such as for example fixed functions logic devices, arithmetic circuits, sequential logic devices (e.g., flip-flops, counters and registers) and programmable logic devices, which are configured to perform different computations on approximated product values. The keep logic 306 generates keep signals provided to the sets of multiplexor arrays 300 for determining which 6 elements, from the array of 8 data elements, are to be kept and provided to the MACs 212 for matrix multiplication. For example, as described in more detail below, the keep logic 306 is used to sum values of the bits of corresponding significance of the product exponents, starting with the most significant bits for the product exponent values, and comparing each of the sums to the target number (e.g., 6) of product exponent values until the target number of product exponent values is determined.

Each set of multiplexor arrays 300 shown in FIG. 3 are configured to receive bits of the same significance for each one of the corresponding 8 element values (i.e. A0-A7) of matrix A and configured to receive keep signals (K0-K7) determined by the keep logic 306. The output values (e.g., A'0, A'1, A'2, A'3, A'4 and A'5) provided by the multiplexor arrays 300, correspond to the 6 of the 8 elements which are selected to be provided to the MACs 212 for matrix multiplication. The 6 elements selected to be kept are elements, which when multiplied with 6 corresponding elements from the second matrix B, are determined to produce the 6 largest product values among the 8 product values.

The product value is approximated by 2, raised to the sum of the exponents of operands A and B. When the MAC unit 212 does exact multiplication, however, the mantissa values are also multiplied and the values are rounded. As a result, one or more of the exact products of dropped values of A and B can be larger than the kept values, which for applications such as machine learning, can result in a small, but acceptable decrease in the accuracy of the network. In addition, the possible small decrease in accuracy is outweighed by the reduction in time to perform the matrix multiply operation (e.g., 25% reduction in time as described above).

As shown in FIG. 3, N arrays are used to receive the bits of the same significance for each one of the 8 element values (A0-A7) of matrix A, where N is the number of bits of each element value If, for example, each of the element values of matrix A include 4 bits, 4 sets of multiplexor arrays 300 are used for matrix A. Each set of multiplexor arrays 300 receives, in parallel, corresponding bits of significance of the elements and the keep signals from the keep logic 306. That is, the first set of multiplexor arrays receives the most significant bits (i.e., the first bits) of the 8 element values of matrix A, the second set of multiplexor arrays 300 receives the next most significant bits (i.e., the second bits) of the 8 element values of matrix A, the third set of multiplexor arrays 300 receives the third bits of the 8 element values of matrix A and the fourth set of multiplexor arrays 300 receives the least significant bits of the 8 element values of matrix A.

In addition, the data compressor 214 also includes sets of multiplexor arrays 300 configured to receive, in parallel, corresponding bits of significance of the element values and keep signals from the keep logic 306. Accordingly, for the example in which each of the element values (B0-B7) include 4 bits, 4 sets of multiplexor arrays 300 are also used for matrix B. The architecture of the sets of multiplexor arrays 300 used for matrix B and the functions of the sets of multiplexor arrays 300 used for matrix B are the same as the sets of multiplexor arrays 300 shown and described for matrix A (with the exception that the multiplexor arrays 300 used for matrix B receive the bits and keep signals associated with Matrix B). Accordingly, the detailed description and illustration of the sets of multiplexor arrays used for matrix B are omitted as being superfluous.

As shown in FIG. 3, each set of multiplexor arrays 300 includes a first array of multiplexors 302 and a second array of multiplexors 304. The first array of multiplexors 302 includes 6 multiplexors 302(1), 302(2), 302(3), 302(4), 302(5) and 302(6). The second array of multiplexors 304 includes 6 multiplexors 304(1), 304(2), 304(3), 304(4), 304(5) and 304(6). The number of multiplexors in the first and second arrays 302 and 304 shown in FIG. 3 are merely used an example for the case where 8 input elements of a matrix are reduced to 6. Features of the disclosure can be implemented using multiplexor arrays having any number of multiplexors.

As shown in FIG. 3, each multiplexor 302(1)-302(6) in the first array 302, of the first set of multiplexor arrays 300, receives a bit value from the 7th element value of matrix A (A6) and a bit value from the 8th element value of matrix A (A7). Each multiplexor 302(1)-302(6) in the first array 302 also receives a corresponding U value (i.e., U0, U1, U2, U3, U4, U5), where U0=K6 (the keep signal value for the element value A6), U1=K0 &&U0 (i.e., the value of U1=1 if K0 and K6 are both 1), U2=K1 && K0 && U0, U3=K2 && K1 && K0 && U0, U4=K3 && K2 && K1 && K0 && U0 and U5=K4 && K3 && K2 && K1 && K0 && U0.

Each multiplexor 304(1)-304(6) in the second array 304 receives a bit value from a corresponding element value of matrix A (A0-A5) as well as a corresponding keep bit value (i.e., K0-K5). Examples of the functions of the multiplexor arrays 302 and 304 are described below with regard to blocks 412-420 of FIG. 4.

Figure 4:
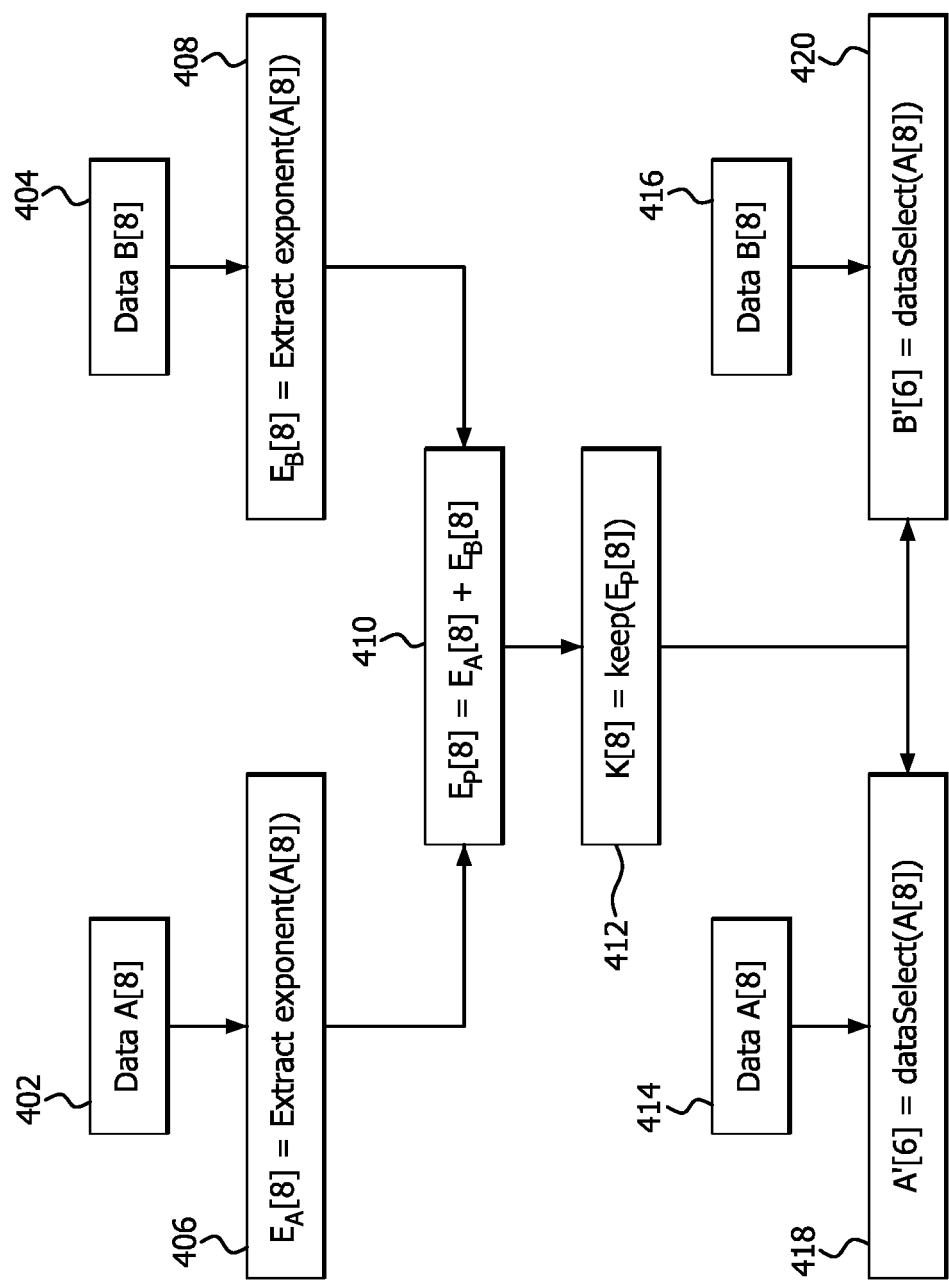
FIG. 4 is a flow diagram illustrating an example method of selecting data for matrix multiplication according to features of the disclosure.

FIG. 4 is a flow diagram illustrating an example method 400 of selecting data for matrix multiplication according to features of the disclosure. As described above, two matrices are typically divided into smaller portions (e.g., columns, rows, and portions of columns and rows) and a matrix multiplication operation of the two matrices is performed by executing a plurality of matrix multiplication computations each including the multiplication of a portion of one matrix with a portion of another matrix An example of a partial matrix multiplication of two matrices, A and B, and an output matrix C is illustrated in FIG. 6. A matrix multiplication operation includes the calculation C=A×B, where A, B, C are matrices of sizes M×K, K×N, and M×N, respectively. Each element in matrix C is a dot product of a row of matrix A and a column of matrix B. Matrix A and matrix B are illustrated at the top of FIG. 6. For example, a part of the matrix multiplication of matrices A and B is performed, according to features of the present disclosure, by approximating product values of the 4 elements 602(1)-602(4) of element array 602 of matrix B and 4 corresponding elements 604(1)-604(4) of array 604 of matrix B to produce the result in portion 1 (P1) of matrix C.

Although the sizes of matrix A and matrix B in FIG. 6 are different from each other, matrix multiplication operation can be performed for matrices if the number of columns in one matrix is equal to the number of rows in the other matrix. In the example shown in FIG. 6, matrix A includes eight columns and matrix B includes 8 rows. The number of columns and rows in matrices A and B are merely an example. Matrix multiplication is performed, according to features of the present disclosure, for matrices of any size meeting the general rules for matrix multiplication (e.g., number of columns in matrix A is equal to the number of rows in matrix B.

Referring back to FIG. 4, as shown at blocks 402 and 404, the method 500 includes receiving (e.g., by data compressor 214 of CU 202) a portion of data (Data A[8]) of a first matrix A and a portion of data (Data B[8]) of a second matrix B. In the example shown in FIG. 4, each portion of data includes 8 elements (i.e., values). That is, the 8 elements of data of matrix A are represented as Data A[8] in FIG. 4 and the 8 elements of data of matrix B are represented as Data B[8] in FIG. 4. The number of elements shown in FIG. 4, however, is merely an example. Portions of data can include any number elements to be provided to MACs 212 to perform matrix multiplication.

The portions of data of the first matrix and the second matrix can be any one of a plurality of data types, such as for example, an integer data type (e.g., int8 format) and a float data type (e.g., BF16 format). The number of bits representing each element depends on the float format (e.g., FP32, FP16, BF16) and integer format being used (e.g., int8, int16, int32). For example, for float format BF16, each element is represented 16 bits while each exponent is represented by 8 bits.

As shown at blocks 406 and 408, the method 300 includes extracting the exponents from the elements in the portions of data of the first matrix A and the second matrix B. That is, the exponents are extracted from each of the 8 elements of the first matrix A (shown as "$E_A[8]$=Extract exponent(A[8])" at block 406) and the exponents are extracted from each of the 8 elements of the second matrix B (shown as "$E_B[8]$=Extract exponent(B[8])" at block 408).

If the elements of the portions of data of the first and second matrices are float data types, then the exponent values can be just extracted from the exponent bits of each element. For example, if the elements are in BF16 format, the first bit is a sign bit, bits 2 to 9 are the exponent bits and bits 10-16 are the mantissa bits. Accordingly, the exponent values can be extracted from the values of bits 2 to 9.

If the elements of the portions of data of the first matrix A and the second matrix B are integer data type (int8), the exponents are extracted by determining the absolute values for the elements of each sub-portion of data ($A_a[8]$, $B_a[8]$), determining the number of leading zeros to be dropped for each element, representing each element as $1.M*2^e$ (where M is the mantissa of the element value and e is the exponent of the element value) and approximating the exponent value for each element as [the number of bits−1]−$L_A$ (where $L_A$ is the number of leading zeros of the element).

By way of example, if the absolute value of the first element of the first matrix ($A_a[1]$) is 00001011, four leading zeroes are determined to be dropped. The element is represented as $1.011*2^e$ and the exponent value (e) for A[1] is calculated as [the number of bits–1]–$L_A$=7–4=3. If the absolute value of the first element of the second matrix ($B_a$[1]) is 00101111, two leading zeroes are determined to be dropped. The element is represented as 1.01111*$2^e$ and the exponent value (e) for A[1] is calculated as [the number of bits–1]–$L_B$=7–2=5. Accordingly, the exponent of the approximate product (P) of A[1] and B[1] is determined to be 14–($L_A$+$L_B$)=14–8=6.

The same process is performed to determine the approximate product of the remaining 7 elements (A[2-8]) of the sub-portion of the first matrix A and the corresponding remaining 7 elements (B[2-8]) of the sub-portion of the second matrix B.

At block 410, product values (i.e., products) of 8 corresponding element pairs of the first and second matrices are approximated. That is, the product of the first corresponding element pair is approximated as the sum of the extracted exponents of the first element of matrix A and the first element of matrix B (i.e., $E_A$[1]+$E_B$[1]), the product of the second element pair is approximated as the sum of the extracted exponents of the second element of matrix A and the second element of matrix B (i.e., $E_A$[2]+$E_B$[2]), and so on, until the products of each of the 8 corresponding element pairs are approximated (shown as $E_P$[8]=$E_A$[8]+$E_B$[8] at block 410).

The approximated product values $E_P$[8] are analyzed using the keep logic 306 and, based on the analysis, keep signals K[8] are generated, as shown at block 412. The keep signals K[0]-K[5] are provided to the multiplexors 302 and the keep signal K[6] is provided to the multiplexors 304 (where the value of the keep signal K7 is inferred from the values of K0-K6) to determine which 6 elements are selected from both matrix A and matrix B and provided to the MACs 212 for the matrix multiplication. The 8 data elements (Data A[8]) from matrix A and the 8 data elements (Data B[8]) are received again, as shown at blocks 414 and 416. The 6 elements (A'[6]) from matrix A and the 6 elements (B'[6]) from matrix B are selected, as shown at blocks 418 and 420, among the 8 data elements (i.e., dataSelect(A[8] and dataSelect(B[8]) to be provided to the MACs 212, based on the outputs of the multiplexor arrays 302 and 304.

Examples of analyzing the approximated product values $E_P$[8] and generating the keep signals (K[8]) are now described using examples of 4 different arrays of product exponent values shown in FIGS. 5A through 5D. For simplification purposes, the product exponent values illustrated in FIGS. 5A through 5D are 4 bit values. Features of the present disclosure can be implemented, however, for product exponent values having any number of bits. In addition, the examples described below, arrays of 8 product exponent values are used and a keep bit value is determined for each corresponding product exponent value. The keep logic 306 is configured such that a true value (e.g., value of 1) is generated for 6 keep bits corresponding to the 6 out of the 8 product exponent values determined to be kept and a false value (e.g., value of 0) is generated for the 2 keep bit values corresponding to the remaining 2 target number of product exponent values determined to be dropped. Features of the present disclosure can be implemented, however, for any number of product exponent values and any target number of product exponent values to be dropped. For example, if 5 product exponent values out of 8 product exponent values of A and B are to be kept, then the keep logic 306 is configured to generate a true value for 5 keep bits corresponding to 5 of the 8 product exponent values determined to be kept and a false value is generated for the 3 keep bit values corresponding to the remaining 3 target number of product exponent values determined to be dropped.

For each of the arrays shown in FIGS. 5A through 5D, the determination of which keep signals are true and which keep values are false includes summing the values of the bits of corresponding significance of the product exponents, starting with the most significant bits for the product exponent values, and comparing each of the sums to the target number (e.g., 6, when 6 out of 8 values of A and B are to be kept) of product exponent values until the target number of keep bit values are determined to be true.

For example, for the array of 8 product exponent values shown in FIG. 5A, the MSBs of the 8 product exponent values are summed. In this case, the sum of MSBs of the 8 product exponent values is 6, which is equal to the target number of 6 product exponent values to be kept. The 6 product exponent values, in which the MSB is 1, are determined as the product exponent values to be kept and the keep bits are set to 1 for the product exponent values where the MSB is 1. That is, because the MSB is 1 for the 1$^{st}$ product exponent value ($E_p$[0]), the second product exponent value ($E_p$[1]), the 3$^{rd}$ product exponent value ($E_p$[2]), the fifth product exponent value ($E_p$[4]), the 6$^{th}$ product exponent value ($E_p$[5]) and the 8th product exponent value ($E_p$[7]), the corresponding keep bit values (K0, K1, K2, K4, and K5) are set to 1, with the keep bit value of K7 being inferred as 1 from the values of K0-K6. The 2 product exponent values, in which the MSB is 0, are determined as the product exponent values to be dropped and the keep bit values K3 and K6 are set to 0.

For the array of 8 product exponent values shown in FIG. 5B, the sum of MSBs of the 8 product exponent values is 8, which is greater than the target number of 6 values of A and B to be kept. When the sum of the MSBs is greater than 6, the bits of the next lower significance of the 8 product exponent values are summed. In this case, the sum of the bits of the next lower significance (i.e., the 2$^{nd}$ bits) of the 8 product exponent values starting with "11" is equal to 4. Accordingly, the product exponent values, starting with "11" are identified as the 4 largest product exponent values and are the corresponding keep bits are set to 1 for the product exponent values, starting with "11." That is, because the 1$^{st}$ product exponent value ($E_p$[0]), the second product exponent value ($E_p$[1]), the 4$^{th}$ product exponent value ($E_p$[3]) and the 8th product exponent value ($E_p$[7]) each start with "11," the corresponding keep bit values (K0, K1, K3) are set to 1, with the keep bit value of K7 being inferred as 1 from the values of K0-K6. Because the 4 largest product exponent values are 2 less than the target number of 6, however, the product exponent values starting with "101" are identified, the next least significant bits (i.e., 3rd bits) of the product exponent values starting with "101" are summed and the result is added to the previous sum. In this case, the sum of the 3rd bits of the product exponent values starting with "101" is equal to 2, which when added to the previous sum of 4, is equal to the target number of 6. Accordingly, the 2 product exponent values, starting with "101" are also identified as product exponent values to be kept. That is, because the 5th product exponent value ($E_p$[4]) and the 6th product exponent value ($E_p$[5]) each start with "101," the corresponding keep bit values K4 and K5 are also set to 1 and the keep bit values K2 and K6, corresponding to the remaining 2 product exponent values to be dropped, are set to 0.

For the array of 8 product exponent values shown in FIG. 5C, the sum of the MSBs of the 8 product exponent values is 8, which is greater than the target number of 6 values of input matrices A and B to be kept. As described above, when the sum of the MSBs is greater than 6, the bits of the next lower significance of the 8 product exponent values are summed. In this case (which is the same as the case described above for product exponent values shown in FIG. 5B), the sum of the bits of the next lower significance (i.e., the 2nd bits) of the 8 product exponent values is equal to 4. Accordingly, the product exponent values starting with "11" are identified as the 4 values to be kept. Accordingly, the keep bit values for K0, K1, K3 and K7 are set to 1 for the product exponent values, starting with "11." But because the 4 largest product exponent values are 2 less than the target number of 6, the product exponent values starting with "101" are identified and the next least significant bits (i.e., 3rd bits) of the product exponent values starting with "101" are summed and added to the previous sum of 4. In this case, the sum of the 3rd bits of the product exponent values starting with "101" is equal to 3, which when added to the previous sum of 4 is equal to 7. Because the total sum of 7 is greater than the target number of 6, the least significant bits (i.e. the 4th bits) of the 8 product exponent values starting with "1011" are summed, which is again equal to 3, and when added to the previous sum of 4, is again greater than the target number of 6. In this case, because there are no more bits to be summed and the total of the previous sums is greater than the target number, the first 2 product exponent values ($E_p[4]$ and $E_p[5]$) starting with "1011" are also kept. Accordingly, the keep bit values K4 and K5 are set to 1 and the keep bit values K2 and K6, corresponding to the remaining 2 product exponent values to be dropped, are set to 0.

For the array of 8 product exponent values shown in FIG. 5D, the sum of the MSBs of the 8 product exponent values is 8, which is greater than the target number of 6 product exponent values to be kept (which is the same as the cases described above for the product exponent values shown in FIGS. 5B and 5C). In this case, however, each of the remaining bits are zero. In this case, the first 6 product exponent values in the array are kept. That is, the keep bits are set to 1 for any of the target number of product exponents values (e.g., the first 6 values in the array).

An example of the hardware implementation of keep logic 306 for the Nth bit position (e.g., position corresponding to the first, second, third or fourth bits of the values shown in FIGS. 5-5C) is as follows:

---

Data Input $I^i_N$, ith data input at $N^{th}$ bit, i = 0, 1, ... 7
Total $T_N$ = Sum($I^i_N$ && $Q^i_{N+1}$)
Accumulated Sum $A_N$ = $C_{N+1}$ + ( $D_{N+1}$ ? 0: $T_N$ )
Enable $E_N$ = ( $T_N$ != 0 ) && ( $A_N$ <= (8 − 2) )
//Comment: 2 values of 8 are dropped
Invert $V_N$ = {( $T_N$ != 0 ) && ( $A_N$ < (8 − 2) )} | | ( $T_N$ == 0 )
Qualify $Q^i_N$ = $Q^i_{N+1}$ && ( $V_N$ ? !$I^i_N$ : $I^i_N$ )

---

An example of the hardware implementation of the keep logic 306 for selecting bits at the Nth position is as follows:

---

Done $D_N$ = $D_{N+1}$
Count $C_N$ = $C_{N+1}$
For i = 0 to 7
{
 Keep $K^i_N$ = $I^i_N$ && $Q^i_{N+1}$ && $E_N$ && !$D_N$
 $C_N$ = $C_N$ + $K^i_N$
 $D_N$ = ( $C_N$ == ( 8 − 2 ) )
}

---

An example of the hardware implementation of keep logic 306 for selecting bits at the −1th position (bit position to the right of the least significant bits in FIG. 5C and FIG. 5D) is as follows:

---

Done $D_N$ = $D_N$+1
Count $C_N$ = $C_N$+1
For I = 0 to 7
{
 $K^i_N$ = $Q^i_{N+1}$ && !$D_N$
 $C_N$ = $C_N$ + $K^i N$
 $D_N$ = ( $C_N$ == ( 8 − 2 ) )
}
Keepi = Σ $K^i_N$ , where sum represents OR over all the values of K

---

Matrix multiplication is then performed on the 6 data elements selected from matrix A and the 6 data elements selected from matrix B. In addition, the information generated by the matrix multiplication operations can be displayed, on a display device (e.g., output device 110 in FIG. 1).

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:
1. A processing device comprising:
memory configured to store data; and
a processor, communicatively coupled to the memory, comprising:
 a plurality of multiplier accumulators (MACs) configured to perform matrix multiplication of elements of a first matrix and elements of a second matrix;
 logic circuitry configured to sum values of bits of corresponding significance of product exponent values of the elements of the first matrix and the second matrix and generate keep bit values for product exponent values to be kept for matrix multiplication; and a plurality of multiplexor arrays each configured to:
receive bits of the elements of the first matrix and the second matrix and the keep bit values; and
provide data for selecting which elements of the first matrix and the second matrix are provided to the MACs for matrix multiplication,
wherein the processor selects which elements are provided to the MACs based on a comparison, by the logic circuitry, of the summed values of the bits of corresponding significance to a target number of product exponent values.

2. The processing device according to claim 1, wherein the logic circuitry is configured to sum values of bits of corresponding significance of the product exponent values.

3. The processing device according to claim 2, wherein the logic circuitry is configured to sum the values of the bits of corresponding significance by starting with summing the most significant bits for the product exponent values and comparing each of the sums to the target number of product exponent values.

4. The processing device according to claim 2, wherein a target number of elements of the first matrix and the second matrix are selected to be kept for matrix multiplication.

5. The processing device according to claim 1, wherein each of the plurality of multiplexor arrays comprises:
a first array of multiplexors, each multiplexor configured to receive:
two of the elements from one of the first matrix and the second matrix and
a select value, for selecting between outputting one of the two elements; and
a second array of multiplexors, each multiplexor configured to receive:
a remaining element, from one of the first matrix and the second matrix, different from the two elements; and
one of the keep bit values for selecting between outputting the one element output from one of the multiplexors in the first array and the remaining element.

6. The processing device according to claim 1, wherein a number of the multiplexor arrays is based on a number of bits representing values of the elements of the first matrix and the second matrix.

7. The processing device according to claim 1, wherein the multiplexor arrays comprise a first set of arrays configured to receive the elements of the first matrix and a second set of arrays configured to receive the elements of the second matrix.

8. The processing device according to claim 1, further comprising a display device,
wherein information generated from the matrix multiplication is displayed on the display device.

9. A processing device comprising:
memory configured to store data; and
a plurality of processor cores in communication with each other and communicatively coupled to the memory, each processor core comprising:
a plurality of multiplier accumulators (MACs) configured to perform matrix multiplication of elements of a first matrix and elements of a second matrix;
logic circuitry configured to:
sum values of bits of corresponding significance of product exponent values of the elements of the first matrix and the second matrix;
compare the summed values of the bits for each level of corresponding significance to a target number of product exponent values; and
generate keep bit values for product exponent values to be kept for matrix multiplication based on the comparison; and
a plurality of multiplexor arrays each configured to:
receive bits of the elements of the first matrix and the second matrix and the keep bit values; and
provide data for selecting which elements of the first matrix and the second matrix are provided to the MACs for matrix multiplication.

10. The processing device according to claim 9, wherein the logic circuitry is configured to sum values of bits of corresponding significance of the product exponent values.

11. The processing device according to claim 10, wherein the logic circuitry is configured to sum the values of the bits of corresponding significance by starting with summing the most significant bits for the product exponent values and comparing each of the sums to the target number of product exponent values.

12. The processing device according to claim 10, wherein a target number of elements of the first matrix and the second matrix are selected to be kept for matrix multiplication.

13. The processing device according to claim 9, wherein each of the plurality of multiplexor arrays comprises:
a first array of multiplexors, each multiplexor configured to receive:
two of the elements from one of the first matrix and the second matrix and
a select value, for selecting between outputting one of the two elements; and
a second array of multiplexors, each multiplexor configured to receive:
a remaining element, from one of the first matrix and the second matrix, different from the two elements; and
one of the keep bit values for selecting between outputting the one element output from one of the multiplexors in the first array and the remaining element.

14. The processing device according to claim 9, wherein a number of the multiplexor arrays is based on a number of bits representing values of the elements of the first matrix and the second matrix.

15. The processing device according to claim 9 wherein the multiplexor arrays comprise a first set of arrays configured to receive the product exponent values for elements of the first matrix and a second set of arrays configured to receive the product exponent values for elements of the second matrix.

16. A processing device for use with matrix multiplication:
a plurality of multiplier accumulators (MACs) configured to perform matrix multiplication of elements of a first matrix and elements of a second matrix;
logic circuitry configured to:
sum values of bits of corresponding significance of product exponent values of the elements of the first matrix and the second matrix;
compare the summed values of the bits for each level of corresponding significance to a target number of product exponent values; and
generate keep bit values for product exponent values to be kept for matrix multiplication; and a plurality of multiplexor arrays each configured to:
  receive bits of the elements of the first matrix and the second matrix and the keep bit values based on the comparison; and
  provide data for selecting which elements of the first matrix and the second matrix are provided to the MACs for matrix multiplication.

17. The processing device according to claim 16, wherein the logic circuitry is configured to sum values of bits of corresponding significance of the product exponent values.

18. The processing device according to claim 17, wherein the logic circuitry is configured to sum the values of the bits by starting with summing the most significant bits for the product exponent values and comparing each of the sums to the target number of product exponent values.

19. The processing device according to claim 17, wherein a target number of elements of the first matrix and the second matrix are selected to be kept for matrix multiplication.

20. The processing device according to claim 16, wherein each of the plurality of multiplexor arrays comprises:
  a first array of multiplexors, each multiplexor configured to receive:
    two of the elements from one of the first matrix and the second matrix and
    a select value, for selecting between outputting one of the two elements; and
  a second array of multiplexors, each multiplexor configured to receive:
    a remaining element, from one of the first matrix and the second matrix, different from the two elements; and
    one of the keep bit values for selecting between outputting the one element output from one of the multiplexors in the first array and the remaining element.

* * * * *